(12) United States Patent
Zhang et al.

(10) Patent No.: US 11,956,905 B2
(45) Date of Patent: Apr. 9, 2024

(54) SOLID STATE HARD DISK CASING AND SOLID STATE HARD DISK

(71) Applicant: BEIJING MEMBLAZE TECHNOLOGY CO., LTD, Beijing (CN)

(72) Inventors: Taile Zhang, Beijing (CN); Guanghua Shangguan, Beijing (CN)

(73) Assignee: BEIJING MEMBLAZE TECHNOLOGY CO., LTD, Beijing (CN)

( * ) Notice: Subject to any disclaimer, the term of this patent is extended or adjusted under 35 U.S.C. 154(b) by 0 days.

(21) Appl. No.: 18/067,383

(22) Filed: Dec. 16, 2022

(65) Prior Publication Data
US 2023/0199977 A1    Jun. 22, 2023

(30) Foreign Application Priority Data

Dec. 22, 2021 (CN) .......................... 202123245605.1
May 11, 2022 (CN) .......................... 202221118227.2

(51) Int. Cl.
*H05K 5/00* (2006.01)
*H01G 9/08* (2006.01)

(52) U.S. Cl.
CPC .............. *H05K 5/0008* (2013.01); *H01G 9/08* (2013.01); *H05K 5/0047* (2013.01)

(58) Field of Classification Search
CPC .............................. H01G 9/08; H05K 5/0056
See application file for complete search history.

(56) References Cited

U.S. PATENT DOCUMENTS

| 9,763,328 B1* | 9/2017 | Zito | H05K 1/183 |
| 11,056,416 B2* | 7/2021 | Kim | H01L 23/3677 |
| 2019/0354145 A1* | 11/2019 | Kim | H01L 23/04 |

FOREIGN PATENT DOCUMENTS

CN    216353351 U    4/2022

OTHER PUBLICATIONS

First Office Action issued in Chinese Patent Application No. 202221118227.2; dated Jul. 13, 2022; 6 pgs.

* cited by examiner

*Primary Examiner* — Hung V Ngo
(74) *Attorney, Agent, or Firm* — HAUPTMAN HAM, LLP

(57) ABSTRACT

A solid state hard disk casing, including: an upper casing and a lower casing fastened to each other, wherein a first lower recess is provided on a side of an inner surface of the lower casing close to one long edge of the lower casing, to accommodate a first portion of one or multiple electrolytic capacitors; a first upper recess is provided on a side of an inner surface of the upper casing close to one long edge of the upper casing, and the first upper recess is opposite to the first lower recess, to accommodate a second portion of the electrolytic capacitor placed in the first lower recess; and a side of the inner surface of the lower casing close to the other long edge of the lower casing is configured to fix a circuit board connected to the electrolytic capacitor.

20 Claims, 9 Drawing Sheets

SOLID STATE HARD DISK CASING AND SOLID STATE HARD DISK

RELATED APPLICATIONS

The present application claims priority from Chinese Application Number 202123245605.1, filed Dec. 22, 2021, and Chinese Application Number 202221118227.2, filed May 11, 2022, the disclosure of which are hereby incorporated by reference herein in their entireties.

TECHNICAL FIELD

The present disclosure relates to the field of the solid state hard disk, and in particular, to the solid state hard disk casing and solid state hard disk.

BACKGROUND

Solid state hard disk, also known as solid state drive, is the hard drive made of the solid state electronic memory chip array, and are the common component for computers and servers. A circuit board is provided inside a solid state hard disk housing, and several major types of electronic components such as a control chip, multiple flash memory chips, a memory (DRAM) chips, a standby power supply (for example, a capacitor having large capacitance), and a power management chip are provided on the circuit board.

The external dimensions of an enterprise solid state hard disk need to meet requirements of standards such as U.2 (SFF8639)/E3.S (SFF-TA-8), in which the external thicknesses are 7 mm and 7.5 mm, respectively. An enterprise solid state hard disk needs to carry a standby power supply for reliability in an unexpected event such as abnormal power off.

SUMMARY

The structure of a solid state hard disk casing needs to be redesigned to meet various requirements in terms of external dimension standard, standby power supply capacity, commercially available capacitor size, and cost.

A solid state hard disk usually uses a supercapacitor as a standby power supply, but a supercapacitor has problems in cost and service life. Therefore, some solid state hard disks use electrolytic capacitors instead of supercapacitors as standby capacitors. However, to provide the same power capacity with an acceptable cost, a larger number of electrolytic capacitors (for example, 47 uF electrolytic capacitors) with standard capacitance values (commercially available) need to be placed, which increases the space occupied by the capacitors within a solid state hard disk casing.

The power provided by a standby power supply is positively related to its size, but there is a contradiction between the size of a standby power supply that provides more capacitance and the limited thickness of a solid state hard disk.

In order to effectively ensure heat dissipation of electronic components on a circuit board, a solid state hard disk housing needs to be in sufficient (close) contact with electronic components on a circuit board it accommodates, so as to conduct heat produced by the electronic components to the outside of the housing.

However, different electronic components have different shapes and sizes (for example, a control chip, multiple flash memory chips, a memory (DRAM) chip, and a power management chip are flat and rectangular, and a capacitor as a standby power supply is cylindrical), and different heat dissipation requirements (for example, a control chip and a memory chip produce large amounts of heat, while a flash memory chip, a power management chip, etc. produce less heat).

Therefore, how to ensure effective heat dissipation of different electronic components in a solid state hard disk is also a technical problem to be solved by those skilled in the art.

Since solid state hard disks have various specifications, the arrangements of electronic components on their circuit boards are different. It is also hoped that a solid state hard disk housing can accommodate circuit boards of solid state hard disks of different specifications, so that one solid state hard disk housing can be configured to assemble various solid state hard disks.

In order to achieve one or more of the above purposes, the present disclosure provides a solid state hard disk casing and a solid state hard disk, to meet various requirements in terms of external dimension standard, standby power supply capacity, commercially available capacitor size, and cost.

According to a first aspect of the present disclosure, a first solid state hard disk casing according to the first aspect of the present disclosure is provided, including: an upper casing and a lower casing fastened to each other, wherein a first lower recess is provided on a side of an inner surface of the lower casing close to one long edge of the lower casing to accommodate a first portion of one or multiple electrolytic capacitors; a first upper recess is provided on a side of an inner surface of the upper casing close to one long edge of the upper casing, and the first upper recess is opposite to the first lower recess, to accommodate a second portion of the electrolytic capacitor placed in the first lower recess; and a side of the inner surface of the lower casing close to the other long edge of the lower casing is configured to fix a circuit board connected to the electrolytic capacitor.

According to the first solid state hard disk casing according to the first aspect of the present disclosure, a second solid state hard disk casing according to the first aspect of the present disclosure is provided, wherein both the upper casing and the lower casing are rectangular.

According to the first or second solid state hard disk casing according to the first aspect of the present disclosure, a third solid state hard disk casing according to the first aspect of the present disclosure is provided, wherein both the first lower recess and the first upper recess are rectangular.

According to one of the first to third solid state hard disk casings according to the first aspect of the present disclosure, a fourth solid state hard disk casing according to the first aspect of the present disclosure is provided, wherein the circuit board is rectangular, and a long edge direction of the circuit board is the same as a long edge direction of the lower casing and a long edge direction of the upper casing.

According to one of the first to fourth solid state hard disk casings according to the first aspect of the present disclosure, a fifth solid state hard disk casing according to the first aspect of the present disclosure is provided, wherein the circuit board does not invade spaces occupied by the first upper recess and the first lower recess in a thickness direction of the upper casing and the lower casing, so that regions where the first upper recess and the first lower recess are located only accommodate electrolytic capacitors in the thickness direction.

According to one of the first to fifth solid state hard disk casings according to the first aspect of the present disclosure, a sixth solid state hard disk casing according to the first aspect of the present disclosure is provided, wherein multiple electrolytic capacitors in the first lower recess/first upper recess are parallel to each other, and a placement direction of the electrolytic capacitors in the first lower recess and the first upper recess is perpendicular to an extension direction of the first lower recess/first upper recess.

According to one of the first to sixth solid state hard disk casings according to the first aspect of the present disclosure, a seventh solid state hard disk casing according to the first aspect of the present disclosure is provided, wherein a width of the first lower recess/the first upper recess is just enough to accommodate a length of the electrolytic capacitors.

According to one of the first to seventh solid state hard disk casings according to the first aspect of the present disclosure, an eighth solid state hard disk casing according to the first aspect of the present disclosure is provided, wherein the first lower recess/the first upper recess accommodates 13 47 uF electrolytic capacitors.

According to one of the first to eighth solid state hard disk casings according to the first aspect of the present disclosure, a ninth solid state hard disk casing according to the first aspect of the present disclosure is provided, wherein the thickness of the upper casing and the lower casing after fastening is 7 mm or 7.5 mm.

According to one of the first to ninth solid state hard disk casings according to the first aspect of the present disclosure, a tenth solid state hard disk casing according to the first aspect of the present disclosure is provided, wherein fastening protrusions extending upward are provided at four corners of the inner surface of the lower casing, and an upper surface of each of the fastening protrusions is provided with a screw hole extending downward; and through screw holes are provided at four corners of the upper casing, so that screws pass through the screw holes on the upper casing and are screwed into the screw holes on the fastening protrusions to fasten the upper casing and the lower casing.

According to one of the first to tenth solid state hard disk casings according to the first aspect of the present disclosure, an eleventh solid state hard disk casing according to the first aspect of the present disclosure is provided, wherein the height of fastening protrusions are lower than the height of sidewalls of the lower casing; and parts around the screw holes on the upper casing are recessed downward from an outer surface of the upper casing, and parts around the screw hole on the upper casing is protrude downward from the inner surface of the upper casing to form projections, so as to fit the corresponding fastening protrusions.

According to one of the first to eleventh solid state hard disk casings according to the first aspect of the present disclosure, a twelfth solid state hard disk casing according to the first aspect of the present disclosure is provided, wherein the fastening protrusions further extend to sidewalls of the lower casing, so that the sidewalls of the lower casing and the fastening protrusions form integrated structures.

According to one of the first to twelfth solid state hard disk casings according to the first aspect of the present disclosure, a thirteenth solid state hard disk casing according to the first aspect of the present disclosure is provided, wherein the first lower recess is provided between two fastening protrusions on the lower casing, and the two fastening protrusions are close to a same long edge of the lower casing; and the first upper recess is provided between two projections on the upper casing, and the two projections are close to a same long edge of the upper casing.

According to one of the first to thirteenth solid state hard disk casings according to the first aspect of the present disclosure, a fourteenth solid state hard disk casing according to the first aspect of the present disclosure is provided, wherein the extension direction of the first lower recess is the same as the long edge direction of the lower casing, and the extension direction of the first upper recess is the same as the length direction of the upper casing.

According to one of the first to fourteenth solid state hard disk casings according to the first aspect of the present disclosure, a fifteenth solid state hard disk casing according to the first aspect of the present disclosure is provided, wherein a second lower recess is further provided between a short edge of the first lower recess and a sidewall in a short edge direction of the lower casing to accommodate a first portion of one or multiple electrolytic capacitors; and a second upper recess is further provided between a short edge of the first upper recess and a sidewall in a short edge direction of the upper casing, and the second upper recess is opposite to the second lower recess, to accommodate a second portion of the electrolytic capacitor placed in the second lower recess.

According to one of the first to fifteenth solid state hard disk casings according to the first aspect of the present disclosure, a sixteenth solid state hard disk casing according to the first aspect of the present disclosure is provided, wherein the placement direction of the electrolytic capacitor in the second upper recess and the second lower recess is parallel to the placement direction of the electrolytic capacitor in the first upper recess and the first lower recess.

According to one of the first to sixteenth solid state hard disk casings according to the first aspect of the present disclosure, a seventeenth solid state hard disk casing according to the first aspect of the present disclosure is provided, wherein the second lower recess accommodates a first portion of only one electrolytic capacitor, and the second upper recess accommodates a second portion of only one electrolytic capacitor.

According to one of the first to seventeenth solid state hard disk casings according to the first aspect of the present disclosure, an eighteenth solid state hard disk casing according to the first aspect of the present disclosure is provided, wherein the extension direction of the second lower recess is the same as the short edge direction of the lower casing, and the extension direction of the second upper recess is the same as the short edge direction of the upper casing.

According to one of the first to eighteenth solid state hard disk casings according to the first aspect of the present disclosure, a nineteenth solid state hard disk casing according to the first aspect of the present disclosure is provided, wherein the part configured to fix the circuit board on the inner surface of the lower casing is a plane, so that the inner surface of the lower casing attaches a component on the lower side of the circuit board; and the part corresponding to the circuit board on the inner surface of the upper casing is a plane, so that the inner surface of the upper casing attaches a component on the upper side of the circuit board.

According to one of the first to nineteenth solid state hard disk casings according to the first aspect of the present disclosure, a twentieth solid state hard disk casing according to the first aspect of the present disclosure is provided, wherein four fixing protrusions are provided on the inner surface of the lower casing, fastening protrusions close to two of the fixing protrusions are two fastening protrusions distant from the first lower recess, and the other two fixing protrusions are at the short edges of the lower casing and are close to the first lower recess; and the upper surface of each of fixing protrusions is provided with a screw hole extending downward, so as to fix the circuit board to the fixing protrusion by means of a screw.

According to one of the first to twentieth solid state hard disk casings according to the first aspect of the present disclosure, a twenty-first solid state hard disk casing according to the first aspect of the present disclosure is provided, wherein a third lower recess corresponding to a capacitor through hole is provided on the inner surface of the lower casing, so as to accommodate a first portion of one or multiple electrolytic capacitors through the third lower recess, and the capacitor through hole is provided at a vacant position of the circuit board and runs through the circuit board; and a third upper recess corresponding to the capacitor through hole on the circuit board is provided on the inner surface of the upper casing, and the third upper recess is opposite to the third lower recess, to accommodate a second portion of the electrolytic capacitor placed in the third lower recess and passing through the capacitor through hole.

According to one of the first to twenty-first solid state hard disk casings according to the first aspect of the present disclosure, a twenty-second solid state hard disk casing according to the first aspect of the present disclosure is provided, wherein the placement direction of the electrolytic capacitor in the third upper recess and the third lower recess is parallel to the placement direction of the electrolytic capacitor in the first upper recess and the first lower recess; and the orientation of pins of the electrolytic capacitor in the third upper recess and third lower recess is opposite to the orientation of pins of the electrolytic capacitor in the first upper recess and the first lower recess.

According to one of the first to twenty-second solid state hard disk casings according to the first aspect of the present disclosure, a twenty-third solid state hard disk casing according to the first aspect of the present disclosure is provided, wherein the third lower recess accommodates first portions of only two electrolytic capacitors, and the third upper recess accommodates second portions of the two electrolytic capacitors.

According to one of the first to twenty-third solid state hard disk casings according to the first aspect of the present disclosure, a twenty-fourth solid state hard disk casing according to the first aspect of the present disclosure is provided, wherein the distances between the third lower recess and the first lower recess and between the third lower recess and the second lower recess are smaller than the distance between the third lower recess and the other long edge of the lower casing, and the distances between the third upper recess and the first upper recess and between the third upper recess and the second upper recess are smaller than the distance between the third upper recess and the other long edge of the upper casing.

According to one of the first to twenty-fourth solid state hard disk casings according to the first aspect of the present disclosure, a twenty-fifth solid state hard disk casing according to the first aspect of the present disclosure is provided, wherein contacts are provided at positions of the circuit board close to the first lower recess and the second lower recess for connection to the electrolytic capacitors placed in the first lower recess and the second lower recess; and pins of the electrolytic capacitors in the first lower recess and the second lower recess face a side of the circuit board.

According to one of the first to twenty-fifth solid state hard disk casings according to the first aspect of the present disclosure, a twenty-sixth solid state hard disk casing according to the first aspect of the present disclosure is provided, wherein in the surrounding of the capacitor through hole on the circuit board, contacts are provided at positions close to the first lower recess and the second lower recess for connection to the electrolytic capacitors placed in the third lower recess; and pins of the multiple electrolytic capacitors in the third lower recess face the first lower recess and second lower recess side.

According to one of the first to twenty-sixth solid state hard disk casings according to the first aspect of the present disclosure, a twenty-seventh solid state hard disk casing according to the first aspect of the present disclosure is provided, wherein there is a predetermined distance between adjacent contacts to ensure safety when the electrolytic capacitors are discharged.

According to one of the first to twenty-seventh solid state hard disk casings according to the first aspect of the present disclosure, a twenty-eighth solid state hard disk casing according to the first aspect of the present disclosure is provided, wherein 28 contacts are provided at positions of the circuit board close to the first lower recess and the second lower recess, and the 28 contacts are arranged in a row on the circuit board; among them, 26 contacts are connected to 13 electrolytic capacitors in the first upper recess and the first lower recess, and the other two contacts are connected to one electrolytic capacitor in the second upper recess and the second lower recess.

According to one of the first to twenty-eighth solid state hard disk casings according to the first aspect of the present disclosure, a twenty-ninth solid state hard disk casing according to the first aspect of the present disclosure is provided, wherein the outer wall of the electrolytic capacitor in the first lower recess and the first upper recess closely attaches the first lower recess and the first upper recess; the outer wall of the electrolytic capacitor in the second lower recess and the second upper recess closely attaches the second lower recess and the second upper recess; and the outer wall of the electrolytic capacitor in the third lower recess and the third upper recess closely attaches the third lower recess and the third upper recess.

According to one of the first to twenty-ninth solid state hard disk casings according to the first aspect of the present disclosure, a thirtieth solid state hard disk casing according to the first aspect of the present disclosure is provided, wherein the inner surface of the upper casing is provided with a fourth upper recess configured to accommodate a control chip on the circuit board.

According to one of the first to thirtieth solid state hard disk casings according to the first aspect of the present disclosure, a thirty-first solid state hard disk casing according to the first aspect of the present disclosure is provided, wherein the fourth upper recess and the third upper recess are respectively provided on two sides of the upper casing in the long edge direction.

According to one of the first to thirty-first solid state hard disk casings according to the first aspect of the present disclosure, a thirty-second solid state hard disk casing according to the first aspect of the present disclosure is provided, wherein an opening configured to accommodate a connector is formed on one short edge side of the upper casing; the fourth upper recess configured to accommodate the control chip is close to the opening configured to accommodate the connector; and the third upper recess is distant from the opening configured to accommodate the connector.

According to one of the first to thirty-second solid state hard disk casings according to the first aspect of the present disclosure, a thirty-third solid state hard disk casing according to the first aspect of the present disclosure is provided, wherein DRAM chips on the circuit board are located at positions of the circuit board adjacent to the electrolytic capacitors, and the DRAM chips are between the contacts on the circuit board and the control chip; and NVM chips are located at positions distant from the electrolytic capacitors.

According to one of the first to thirty-third solid state hard disk casings according to the first aspect of the present disclosure, a thirty-fourth solid state hard disk casing according to the first aspect of the present disclosure is provided, wherein the control chip closely attaches the fourth upper recess after the upper casing and the lower casing are fastened together.

According to the second aspect of the present disclosure, the present disclosure further provides a solid state hard disk casing according to the second aspect of the present disclosure, to accommodate electronic components of shapes and sizes on the circuit board, and ensure effective heat dissipation of different electronic components.

A first solid state hard disk casing according to the second aspect of the present disclosure includes an upper cover and a lower cover fastened to each other; wherein a first projection, a second projection, and a first recess are provided on an inner surface of the upper cover, the first projection and the second projection are configured to attach a flat electronic component protruding from a front surface of a circuit board, and the first recess is configured to accommodate a cylindrical electronic component protruding from the front surface of the circuit board; and a second recess and a third recess are provided on an inner surface of the lower cover, the second recess is configured to attach a flat electronic component protruding from a back surface of the circuit board, and the third recess is configured to accommodate a cylindrical electronic component protruding from the back surface of the circuit board.

According to the first solid state hard disk casing according to the second aspect of the present disclosure, a second solid state hard disk casing according to the second aspect of the present disclosure is provided, wherein the first projection is located on one side of an inner surface of the upper cover, and the second projection and the first recess are located on another side of the inner surface of the upper cover; the second projection is opposite to a part of the first projection, there is a gap of a predetermined distance between the second projection and the first projection, the first recess is opposite to another part of the first projection, and there is a gap of a predetermined distance between the first recess and the first projection; and the gap between the second projection and the first projection extends to be communicated with the gap between the first recess and the first projection to form an air channel.

According to the first and second solid state hard disk casings according to the second aspect of the present disclosure, a third solid state hard disk casing according to the second aspect of the present disclosure is provided, wherein a first sidewall and a second sidewall are provided at two edges of the upper cover on both ends of the air channel; a third sidewall and a fourth sidewall are provided at two edges of the lower cover extending in the same direction as the air channel; and the first sidewall, the second sidewall, the third sidewall, and the fourth sidewall are combined to form sidewalls of the solid state hard disk casing.

According to the first to third solid state hard disk casings according to the second aspect of the present disclosure, a fourth solid state hard disk casing according to the second aspect of the present disclosure is provided, wherein a first opening is formed on the first sidewall of the upper cover, a second opening is formed at a position of the lower cover corresponding to the second sidewall, the first opening is communicated with one end of the air channel, and the second opening is communicated with the other end of the air channel.

According to the first to fourth solid state hard disk casings according to the second aspect of the present disclosure, a fifth solid state hard disk casing according to the second aspect of the present disclosure is provided, wherein the first opening is configured to install a first connector of a solid state hard disk, and the second opening is configured to install a second connector of the solid state hard disk.

According to the first to fifth solid state hard disk casings according to the second aspect of the present disclosure, a sixth solid state hard disk casing according to the second aspect of the present disclosure is provided, wherein the second recess is opposite to the first projection, and an area of the second recess is smaller than that of the first projection.

According to the first to sixth solid state hard disk casing according to the second aspect of the present disclosure, a seventh solid state hard disk casing according to the second aspect of the present disclosure is provided, wherein the third recess is opposite to the first recess.

According to the first to seventh solid state hard disk casings according to the second aspect of the present disclosure, an eighth solid state hard disk casing according to the second aspect of the present disclosure is provided, wherein a first rib region is provided on an outer surface of the upper cover, and the first rib region is opposite to the first projection.

According to the first to eighth solid state hard disk casings according to the second aspect of the present disclosure, a ninth solid state hard disk casing according to the second aspect of the present disclosure is provided, wherein a projection array is provided on an outer surface of the lower cover, and the projection array is opposite to the second recess.

According to the first to ninth solid state hard disk casings according to the second aspect of the present disclosure, a tenth solid state hard disk casing according to the second aspect of the present disclosure is provided, wherein a second rib region is provided on the outer surface of the lower cover, the second rib region is located on one side of the outer surface of the lower cover, and the projection array is located on the other side of the outer surface of the lower cover.

According to a third aspect of the present disclosure, a solid state hard disk according to the third aspect of the present disclosure is provided, including a circuit board, an electrolytic capacitor, and one of the solid state hard disk casings according to the first aspect and the second aspect of the present disclosure; wherein the electrolytic capacitor and the circuit board are both fixed in the solid state hard disk casing.

With respect to the background above, the present disclosure provides solid state hard disk casings and solid state hard disks suitable for accommodating capacitors, to meet various requirements in terms of external dimension standard, standby power supply capacity, commercially available capacitor size, and cost.

BRIEF DESCRIPTION OF THE DRAWINGS

To describe the technical solutions in the embodiments of the present disclosure or in the prior art more clearly, the accompanying drawings required for describing the embodiments or the prior art are briefly introduced below. Apparently, the accompanying drawings in the following description show merely some embodiments recited in the present disclosure, and a person of ordinary skill in the art can also derive other accompanying drawings from these accompanying drawings.

DETAILED DESCRIPTION

Figure 1:
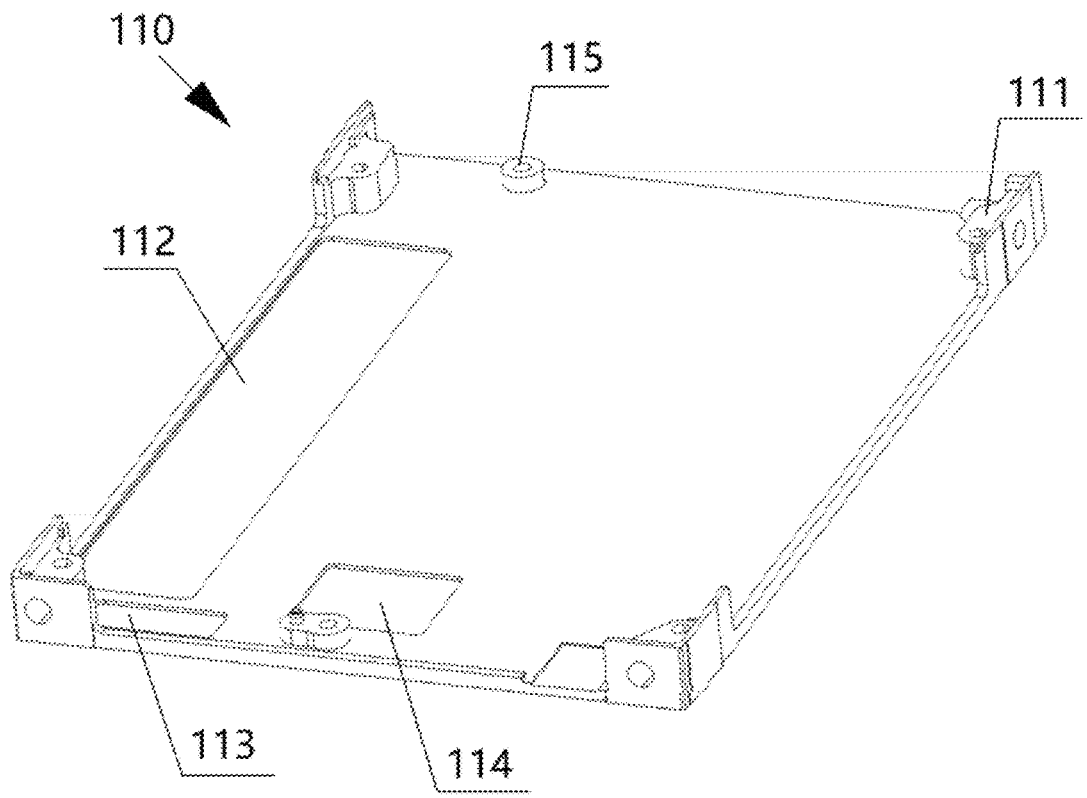
FIG. 1 is the perspective view of the interior of the solid state hard disk lower casing provided by an embodiment of the present disclosure.

Embodiments of the present disclosure are described in detail below, and examples of the embodiments are shown in the accompanying drawings, wherein the same or similar elements or the elements having same or similar functions are denoted by the same or similar reference numerals throughout the description. The embodiments described below with reference to the accompanying drawings are exemplary and used only for explaining the present disclosure, and should not be construed as a limitation on the present disclosure.

Figure 2:
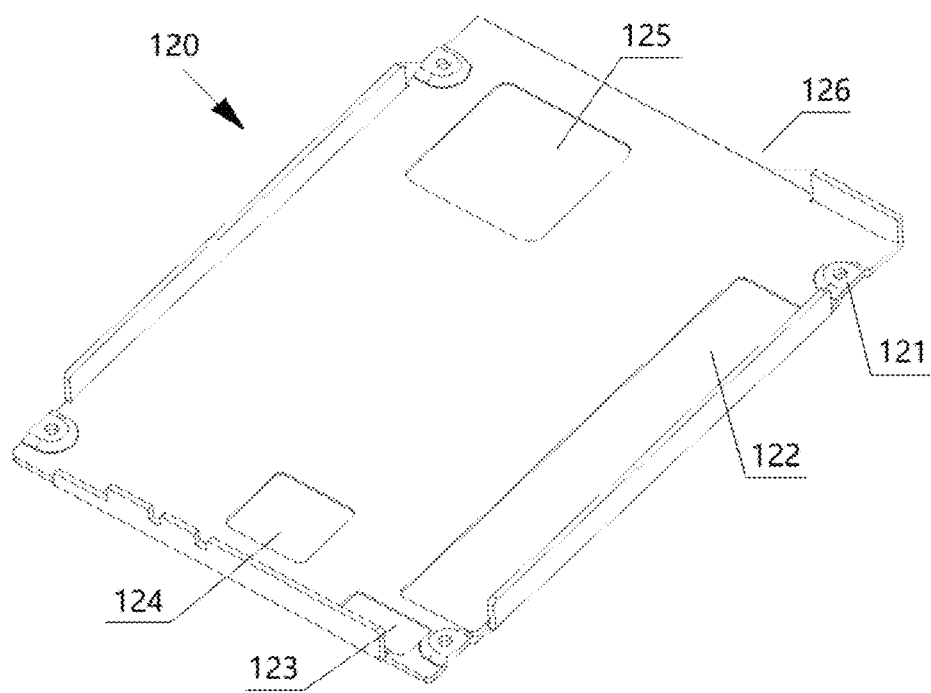
FIG. 2 is the perspective view of the interior of the solid state hard disk upper casing provided by an embodiment of the present disclosure.

With reference to FIG. 1 and FIG. 2, FIG. 1 is a perspective view of the interior of a solid state hard disk lower casing provided in an embodiment of the present disclosure, and FIG. 2 is a perspective view of the interior of a solid state hard disk upper casing provided in an embodiment of the present disclosure.

The present disclosure provides a solid state hard disk casing, including a lower casing 110 and an upper casing 120. The upper casing 120 and the lower casing 110 are fastened together to form the solid state hard disk casing. As an example, both the upper casing 120 and the lower casing 110 are rectangular, or both the upper casing 120 and the lower casing 110 are square.

As an example, a screw hole is provided at each of four corners of the upper casing 120, a screw hole is also provided at each of four corners of the lower casing 110, and screws pass through the screw holes on the upper casing 120 and the screw holes on the lower casing 110, so that after the upper casing 120 and the lower casing 110 are fastened together, the upper casing 120 and the lower casing 110 are fixed to make the solid state hard disk casing more stable. Fastening protrusions 111 extending upward are provided at four corners of the inner surface of the lower casing 110, and there are screw holes extending downward from upper surfaces of the fastening protrusions 111, to ensure that the screw holes have a large length. The "extending upward" refers to extending from the lower casing toward the upper casing after fastening, and the plane in contact with the upper casing is the upper surface of the fastening protrusion 111. The "extending downward" refers to extending from the upper casing toward the lower casing. In addition, the fastening protrusions 111 further extend to sidewalls of the lower casing 110, so that the sidewalls of the lower casing 110 and the fastening protrusions 111 form integrated structures. In addition, the height of the fastening protrusion 111 is lower than the height of the sidewall of the lower casing 110.

A first lower recess 112 is provided on a side of the inner surface of the lower casing 110 close to one long edge of the lower casing 110, and the extension direction of the first lower recess 112 is the same as a long edge direction of the lower casing 110, to accommodate a first portion of one or multiple electrolytic capacitors (for example, 13 47 uF electrolytic capacitors). As an example, multiple electrolytic capacitors are arranged parallel to each other in a row, and a placement direction of the electrolytic capacitors in the first lower recess 112 is perpendicular to the extension direction of the first lower recess 112, that is, the extension direction of the electrolytic capacitors is the same as a short edge direction of the lower casing 110. Optionally, the first lower recess 112 is rectangular, one long edge of the first lower recess 112 is close to one long edge of the lower casing 110, and the other long edge of the first lower recess 112 is distant from the long edge of the lower casing 110. In addition, in an embodiment of the present disclosure, since fastening protrusions 111 are provided at the four corners of the inner surface of the lower casing 110, the first lower recess 112 is provided between two fastening protrusions 111 on the lower casing 110. The two fastening protrusions 111 are close to a same long edge of the lower casing 111. Optionally, a width of the first lower recess 112 is just enough to accommodate a length of the electrolytic capacitors, so that only one row of electrolytic capacitors is accommodated in the first lower recess 112.

In addition, due to the provision of the fastening protrusions 111, there is a certain distance from the first lower recess 112 located between the two fastening protrusions 111 to a short edge of the lower casing 110. Therefore, a second lower recess 113 may be further provided between a short edge of the first lower recess 112 and a sidewall of the lower casing 110 in the short edge direction. The second lower recess 113 is adjacent to a fastening protrusion 111, and the extension direction of the second lower recess 113 is the same as the short edge direction of the lower casing 110, to accommodate a first portion of one or multiple electrolytic capacitors. Optionally, the second lower recess 113 accommodates a first portion of only one electrolytic capacitor.

More optionally, the extension direction of the second lower recess 113 is the same as the short edge direction of the lower casing 110. The placement direction of the electrolytic capacitor in the second lower recess 113 is parallel to the placement direction of the electrolytic capacitor in the first lower recess 112.

A side of the inner surface of the lower casing 110 close to the other long edge of the lower casing 110 is configured to fix a circuit board, and the circuit board and the first lower recess 112 accommodating the electrolytic capacitor are respectively disposed close to two opposite long edges of the lower casing. Optionally, the part configured to fix the circuit board on the inner surface of the lower casing 110 is a plane, so that after the circuit board is mounted, the inner surface of the lower casing 110 can attach a component on the lower side of the circuit board, facilitating heat dissipation of the component. Optionally, the circuit board is rectangular, and the long edge direction of the circuit board is the same as the long edge direction of the lower casing 110. Optionally, four fixing protrusions 115 are provided on the inner surface of the lower casing 110. Fastening protrusions close to two of the fixing protrusions are two fastening protrusions 111 distant from the first lower recess 112, and the other two fixing protrusions 115 are at the short edges of the lower casing 110 and are close to the first lower recess 112. Moreover, the upper surface of each of fixing protrusions 115 is provided with a fixing member (for example, a screw hole extending downward), so as to fix the circuit board to the fixing protrusion 115 by means of the fixing member.

Since the circuit board occupies the space in the thickness direction of the solid state hard disk casing, the position where the circuit board is located of the solid state hard disk casing cannot accommodate an electrolytic capacitor. Therefore, in the thickness direction of the lower casing, the circuit board in the present disclosure does not cover the positions where the first lower recess 112 and the second lower recess 113 are located, that is, the circuit board does not invade the spaces occupied by the first lower recess 112 and the second lower recess 113, so that the regions where the first lower recess 112 and the second lower recess 113 are located only accommodate electrolytic capacitors in the thickness direction.

Figure 3:
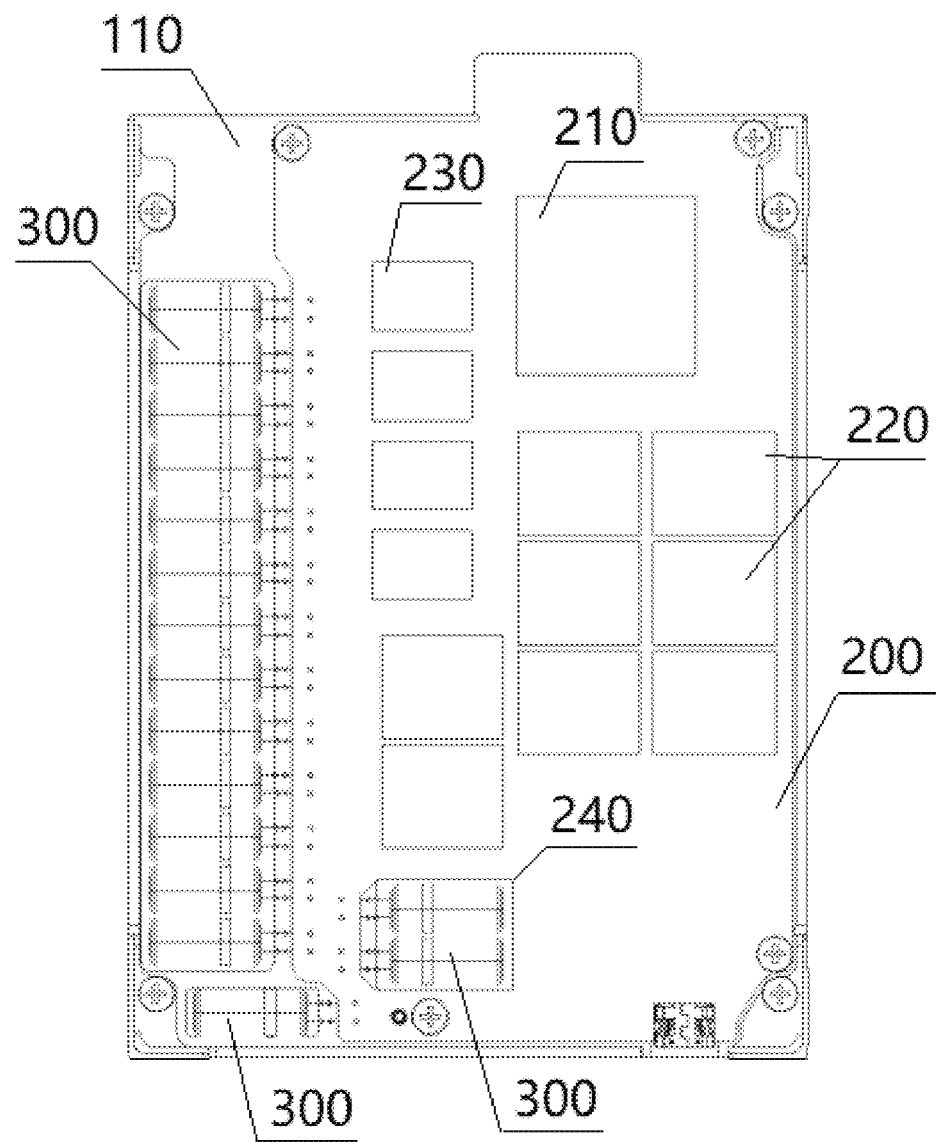
FIG. 3 is the structural diagram of the interior of the solid state hard disk provided by an embodiment of the present disclosure.
Figure 4:
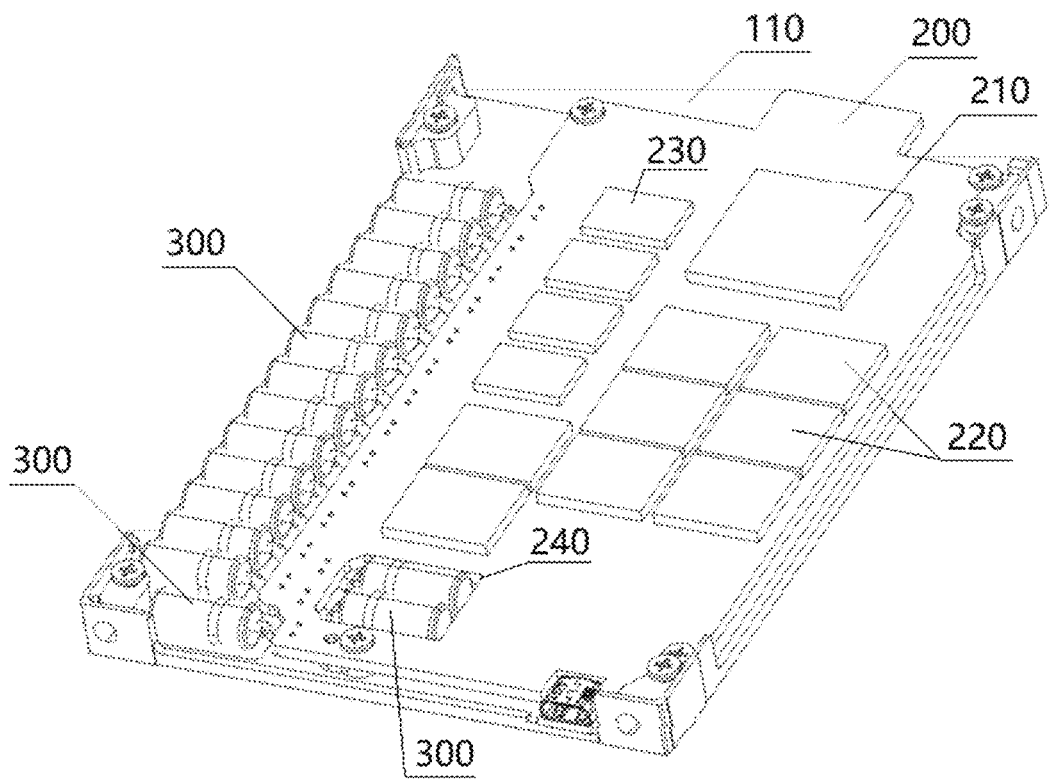
FIG. 4 is the perspective view of FIG. 3.

With reference to FIG. 3 and FIG. 4, FIG. 3 is a structural diagram of the interior of a solid state hard disk provided in an embodiment of the present disclosure, and FIG. 4 is a perspective view of FIG. 3.

A control chip 210, flash memory chips 220 (NVM chips), and DRAM chips 230 are provided on a circuit board 200. A capacitor through hole 240 running through in the vertical direction is provided at a vacant position of the circuit board 200 (that is, a position where the control chip 210, the flash memory chips 220, the DRAM chips 230, and other components are not provided on the circuit board 200). A third lower recess 114 corresponding to the capacitor through hole 240 is provided on the inner surface of the lower casing 110, so as to accommodate a first portion of one or multiple electrolytic capacitors 300 through the third lower recess 114. Moreover, the electrolytic capacitor 300 can also pass through the capacitor through hole 240 on the circuit board 200, so that the electrolytic capacitor 300 can also be provided at a position covered by the circuit board 200, thereby better meeting requirements for a standby power supply. Optionally, the third lower recess 114 accommodates first portions of two electrolytic capacitors 300. Optionally, the distances between the third lower recess 114 and the first lower recess 112 and between the third lower recess 114 and the second lower recess 113 are smaller than the distance between the third lower recess 114 and the other long edge of the lower casing 110. Optionally, the placement direction of the electrolytic capacitor 300 in the third lower recess 114 is parallel to the placement direction of the electrolytic capacitor 300 in the first lower recess 112; and the orientation of pins of the electrolytic capacitor 300 in the third lower recess 114 is opposite to the orientation of pins of the electrolytic capacitor 300 in the first lower recess 112. More optionally, the capacitor through hole 240 is located far away from the control chip 210.

As shown in FIG. 3, the squares on the left side of the control chip 210 on the circuit board are the DRAM chips 230. Compared with the flash memory chips 220, the DRAM chips 230 are closer to contacts connected to the electrolytic capacitors 300 on the circuit board 200. Because the contacts connected to the electrolytic capacitors 300 have a high voltage, and the temperature of the electrolytic capacitors 300 is high during operation, the flash memory chips 220 will be interfered with. That is, the DRAM chips 230 on the circuit board 200 are located at positions adjacent to the electrolytic capacitors 300 on the circuit board 200, and the DRAM chips 230 are between the contacts on the circuit board 200 and the control chip 210. The flash memory chips 220 are located at positions distant from the electrolytic capacitors 300.

For the distribution of the electrolytic capacitors 300 on the lower casing 110, the electrolytic capacitors 300 can be placed in the first lower recess 112 without placing electrolytic capacitors 300 in the second lower recess 113 and the third lower recess 114, but the second lower recess 113 and the third lower recess 114 are still provided on the lower casing 110, to reduce the number of types of solid state hard disk casings for production. Certainly, the electrolytic capacitors 300 can also be placed in the first lower recess 112, the second lower recess 113, and the third lower recess 114. When more electrolytic capacitors 300 need to be placed, requirements for a large standby power supply can be met.

In addition, a restrictive condition for placing each of the electrolytic capacitors 300 is that the electrolytic capacitor 300 needs to be connected to the circuit board 200 through two contacts and leads. Since the electrolytic capacitor 300 needs to output a large current and a high voltage, the two contacts need to have a sufficiently large area and a sufficient distance therebetween. Therefore, there should be sufficiently large contact regions between the first lower recess 112, the second lower recess 113, and the third lower recess 114 where the electrolytic capacitors 300 need to be placed and the circuit board 200 to accommodate these contacts.

Optionally, contacts are provided at positions of the circuit board 200 close to the first lower recess 112 and the second lower recess 113 for connection to the electrolytic capacitors 300 placed in the first lower recess 112 and the second lower recess 113. As an example, there is a predetermined distance between adjacent contacts to ensure safety when the electrolytic capacitors 300 discharge. As another example, there are 13 electrolytic capacitors 300 in a row in the first lower recess 112, and one electrolytic capacitor 300 in the second lower recess 113. Therefore, 28 contacts are provided at positions of the circuit board 200 close to the first lower recess 112 and the second lower recess 113, and the 28 contacts are arranged in a row on the circuit board 200. Among them, 26 contacts are connected to 13 electrolytic capacitors 300 in the first lower recess 112, and the other two contacts are connected to the one electrolytic capacitor 300 in the second lower recess 113. As another example, the electrolytic capacitors 300 are cylindrical electrolytic capacitors. The axial direction of the cylindrical electrolytic capacitors is perpendicular to a long edge of the circuit board 200. The arrangement direction of the multiple cylindrical electrolytic capacitors in the first lower recess 112 is perpendicular to the axial direction of the cylindrical electrolytic capacitors. Pins of the cylindrical electrolytic capacitors in the first lower recess 112 and the second lower recess 113 face the circuit board 200 side. The contacts are on the side of the circuit board 200 close to the first lower recess 112 and the second lower recess 113.

More optionally, in the surrounding of the capacitor through hole 240 on the circuit board 200, contacts are provided at positions close to the first lower recess 112 and the second lower recess 113 for connection to the electrolytic capacitors placed in the third lower recess 114. For example, the electrolytic capacitors 300 are cylindrical electrolytic capacitors. The axial direction of the cylindrical electrolytic capacitors is perpendicular to a long edge of the circuit board 200. Pins of the multiple cylindrical electrolytic capacitors in the third lower recess 114 face the first lower recess 112 and second lower recess 113 side. The contacts are on the side of the surrounding of the capacitor through hole 240 close to the first lower recess 112 and the second lower recess 113.

Through the first lower recess 112, the second lower recess 113, and the third lower recess 114, a larger thickness space is provided for the electrolytic capacitors 300 (the external dimension of the solid state hard disk casing is 7 mm or 7.5 mm, and the diameter of the cylinders of the electrolytic capacitors 300 is 6 mm; thus, the sum of the diameter of the electrolytic capacitors 300 plus the thicknesses of the upper casing 120 and the lower casing 110 cannot exceed 7 mm or 7.5 mm). Therefore, the external dimension standard is met, the solid state hard disk casing can provide large standby power supply capacity according to a commercially available capacitor size, and the cost is also reduced.

With continuing reference to FIG. 1 and FIG. 2, through screw holes are provided at four corners of the upper casing 120, so that screws pass through the screw holes on the upper casing 120 and are screwed into the screw holes on the fastening protrusions 111 on the lower casing 110. In addition, parts around the screw holes on the upper casing 120 are recessed downward from an outer surface of the upper casing 120, so that the upper ends of the corresponding screws are flush with the outer surface of the upper casing 120 after mounting. Due to the thickness limitation of the upper casing 120, the parts around the screw holes on the upper casing 120 are protrude downward from the inner surface of the upper casing 120 to form projections 121, so as to fit the corresponding fastening protrusions 111.

A first upper recess 122 is provided on a side of the inner surface of the upper casing 120 close to one long edge of the upper casing 120, the extension direction of the first upper recess 122 is the same as a length direction (or a long edge direction) of the upper casing 120, and the first upper recess 122 on the upper casing 120 is opposite to the first lower recess 112 on the lower casing 110 (that is, the positions are corresponding), to accommodate a second portion of the electrolytic capacitor 300 (for example, 13 47 uF electrolytic capacitors) placed in the first lower recess 112 on the lower casing 110. As an example, multiple electrolytic capacitors 300 are arranged parallel to each other in a row, and a placement direction of the electrolytic capacitors 300 in the first upper recess 122 is perpendicular to an extension direction of the first upper recess 122, that is, the extension direction of the electrolytic capacitors 300 is the same as a short edge direction of the upper casing 120. Optionally, the first upper recess 122 is rectangular, one long edge of the first upper recess 122 is close to one long edge of the upper casing 120, and the other long edge of the first upper recess 122 is distant from the long edge of the upper casing 120. In addition, since projections 121 are provided at the four corners of the inner surface of the upper casing 120, the first upper recess 122 is provided between two projections 121 on the upper casing 120. The two projections 121 are close to a same long edge of the upper casing 120. Optionally, a width of the first upper recess 122 is just enough to accommodate a length of the electrolytic capacitors 300, so that only one row of electrolytic capacitors 300 is accommodated in the first upper recess 122.

After the upper casing 120 is fastened to the lower casing 110, the side of the inner surface of the upper casing 120 close to the other long edge of the upper casing 120 corresponds to the upper surface of the circuit board 200, and the long edge direction of the circuit board 200 is the same as the long edge direction of the upper casing 120. Optionally, the part corresponding to the circuit board 200 on the inner surface of the upper casing 120 is a plane, so that the inner surface of the upper casing 120 attaches a component on the upper side of the circuit board 200. Moreover, in the thickness direction of the upper casing 120, the circuit board 200 does not invade the space occupied by the first upper recess, so that the region where the first upper recess is located only accommodates the electrolytic capacitors 300 in the thickness direction.

In addition, due to the provision of the projections 121, there is a certain distance from the first upper recess 122 located between the two projections 121 to a short edge of the upper casing 120. Therefore, a second upper recess 123 may be further provided between a short edge of the first upper recess 122 and a sidewall of the upper casing 120 in the short edge direction. The second upper recess 123 is adjacent to a projection 121, the extension direction of the second upper recess 123 is the same as the short edge direction of the upper casing 120, and the second upper recess 123 on the upper casing 120 is opposite to the second lower recess 113 on the lower casing 110, to accommodate a second portion of the electrolytic capacitor 300 placed in the second lower recess 113 on the lower casing 110. Optionally, the second upper recess 123 accommodates a second portion of only one electrolytic capacitor 300. More optionally, the extension direction of the second upper recess 123 is the same as the short edge direction of the upper casing 120. The placement direction of the electrolytic capacitor 300 in the second upper recess 123 is parallel to the placement direction of the electrolytic capacitor 300 in the first upper recess 122.

In addition, with respect to the positional relationships between the circuit board 200 and the first lower recess 112 and between the circuit board 200 and the second lower recess 113, in the thickness direction of the lower casing, the circuit board 200 in the present disclosure does not cover the positions where the first upper recess 122 and the second upper recess 123 are located, either, that is, the circuit board 200 does not invade the spaces occupied by the first upper recess 122 and the second upper recess 123, so that the regions where the first upper recess 122 and the second upper recess 123 are located only accommodate the electrolytic capacitors 300 in the thickness direction.

A third upper recess 124 corresponding to the capacitor through hole 240 on the circuit board 200 is further provided on the inner surface of the upper casing 120, and the third upper recess 124 on the upper casing 120 is opposite to the third lower recess 114 on the lower casing 110, to accommodate a second portion of the electrolytic capacitor 300 placed in the third lower recess 114 on the lower casing 110 and passing the capacitor through hole 240. Optionally, the third upper recess 124 accommodates second portions of two electrolytic capacitors 300. Optionally, the distances between the third upper recess 124 and the first upper recess 122 and between the third upper recess 124 and the second upper recess 123 are smaller than the distance between the third upper recess 124 and the other long edge of the upper casing 120. Optionally, the direction of the electrolytic capacitor 300 in the third upper recess 124 is parallel to the direction of the electrolytic capacitor 300 in the first upper recess 122; and the orientation of pins of the electrolytic capacitor 300 in the third upper recess 124 is opposite to the orientation of pins of the electrolytic capacitor 300 in the first upper recess 122.

On the basis of the above, since the electrolytic capacitors 300 generate heat during operation, the outer wall of the electrolytic capacitor 300 located in the first lower recess 112 and the first upper recess 122 closely attaches the first lower recess 112 and the first upper recess 122, the outer wall of the electrolytic capacitor 300 located in the second lower recess 113 and the second upper recess 123 closely attaches the second lower recess 113 and the second upper recess 123, and the outer wall of the electrolytic capacitor 300 located in the third lower recess 114 and the third upper recess 124 closely attaches the third lower recess 114 and the third upper recess 124, thereby facilitating heat dissipation from the electrolytic capacitors 300.

In addition, since the control chip 210 on the circuit board 200 also has a certain thickness (as shown in FIG. 3 and FIG. 4), the inner surface of the upper casing 120 is further provided with a fourth upper recess 125 (as shown in FIG. 2), that is, a part of the inner surface of the upper casing 120 opposite to the circuit board 200 is provided with a fourth upper recess 125, to accommodate the control chip 210 on the circuit board 200. Thus, a space is provided in the thickness direction for the control chip 210. Moreover, after the upper casing 120 and the lower casing 110 are fastened together, the control chip 210 closely attaches the fourth upper recess 125 to facilitate heat dissipation of the control chip 210. Optionally, the fourth upper recess 125 and the third upper recess 124 are respectively provided on two sides of the upper casing 120 in the long edge direction.

As shown in FIG. 2, the circuit board 200 in the solid state hard disk casing further needs to be connected to a host. Therefore, an opening 126 configured to accommodate a connector for connection to the host is formed on one short edge side of the upper casing 120, so that the circuit board inside the solid state hard disk casing is connected to the host through the connector at the opening 126. For example, one short edge side of the upper casing 120 has a partial sidewall, so that the other part at the short edge side forms an opening 126 configured to accommodate the connector. After the upper casing 120 and the lower casing 110 are fastened, the connector extends from the opening 126 to be connected to the host or inserted into a storage device slot on the host. Optionally, the fourth upper recess 125 accommodating the control chip 210 is close to the opening 126 configured to accommodate the connector, and the third upper recess 124 is distant from the opening 126 configured to accommodate the connector.

In view of the above, in the casing, a space configured to accommodate an electrolytic capacitor can be formed through the first lower recess 112 on the lower casing 110 and the corresponding first upper recess 122 on the upper casing 120, a space configured to accommodate an electrolytic capacitor can also be formed through the second lower recess 113 on the lower casing 110 and the corresponding second upper recess 123 on the upper casing 120, and a space configured to accommodate an electrolytic capacitor can also be formed through the third lower recess 114 on the lower casing 110 and the corresponding third upper recess 124 on the upper casing 120. The spaces inside the casing can be effectively configured to accommodate multiple small capacitors to provide a standby power supply having larger capacity to meet various requirements in terms of external dimension standard, standby power supply capacity, commercially available capacitor size, and cost.

Figure 5:
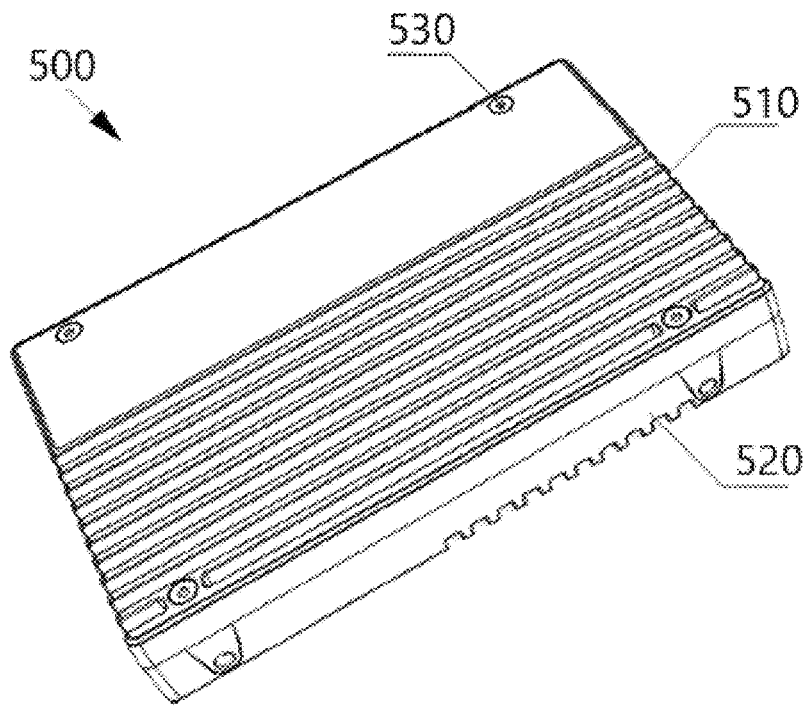
FIG. 5 is the schematic diagram of the solid state hard disk housing provided by another embodiment of the present disclosure.

With reference to FIG. 5, FIG. 5 is a schematic diagram of a solid state hard disk housing (i.e., a solid state hard disk casing) provided in another embodiment of the present disclosure.

The present disclosure provides a solid state hard disk housing 500, including an upper cover 510 and a lower cover 520. The upper cover 510 and the lower cover 520 are fastened together to form the solid state hard disk housing 500. Specifically, a screw hole is provided at each of four corners of the upper cover 510, a screw hole is also provided at each of four corners of the lower cover 520, and screws 530 pass through the screw holes on the upper cover 510 and the screw holes on the lower cover 520, so that after the upper cover 510 and the lower cover 520 are fastened together, the upper cover 510 and the lower cover 520 are fixed to make the solid state hard disk housing 500 more stable.

Figure 6A:
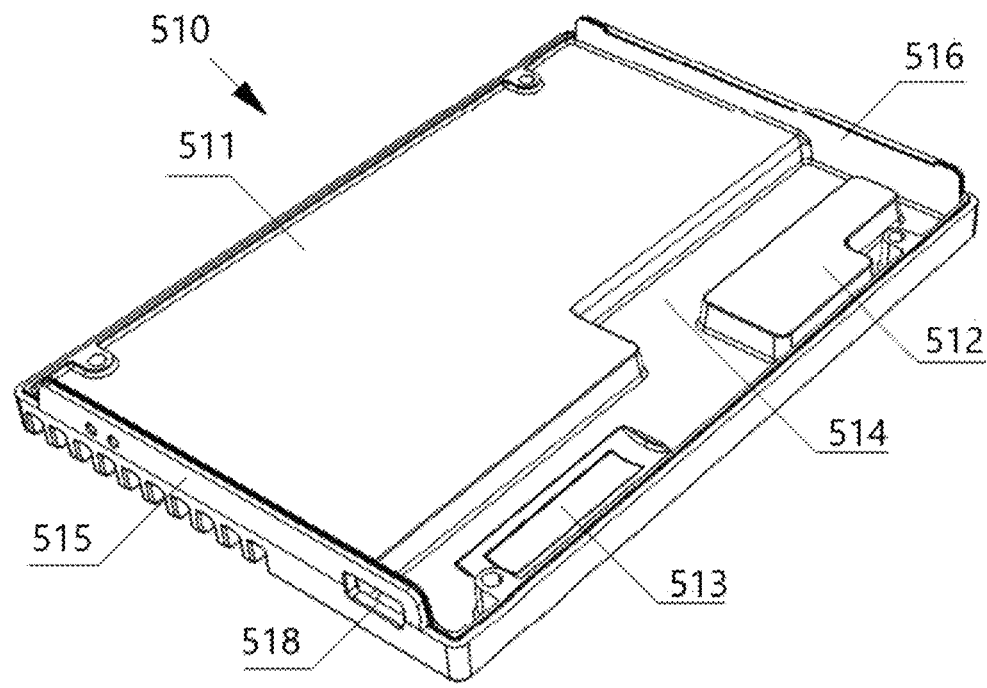
FIG. 6A is the internal schematic diagram I of the upper cover provided by another embodiment of the present disclosure.
Figure 6B:
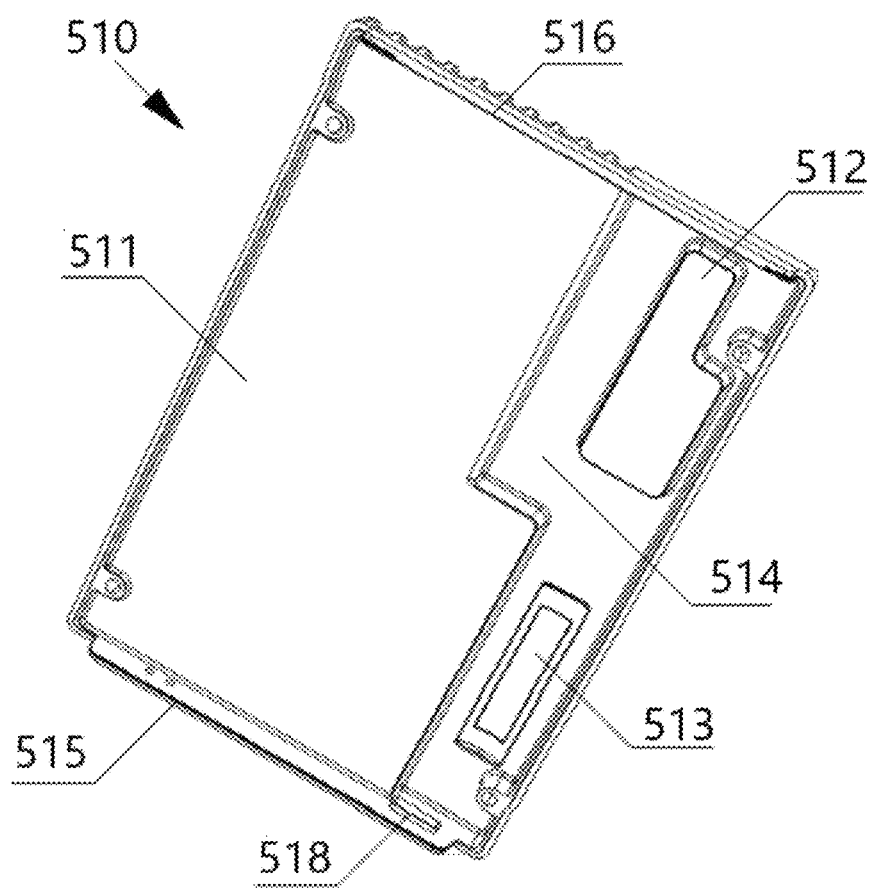
FIG. 6B is the internal schematic diagram II of the upper cover provided by another embodiment of the present disclosure.

With reference to FIG. 6A and FIG. 6B, FIG. 6A is a schematic diagram I of the interior of an upper cover provided in another embodiment of the present disclosure, and FIG. 6B is a schematic diagram II of the interior of an upper cover provided in another embodiment of the present disclosure.

A projection 511 and a projection 512 are provided on the inner surface of the upper cover 510, that is, when the upper cover 510 and the lower cover 520 are fastened together, the projection 511 and the projection 512 extend from the inner surface of the upper cover 510 in a direction close to the lower cover 520, so that the projection 511 and the projection 512 attach flat electronic components protruding from the front surface of a circuit board, thereby ensuring heat dissipation of such electronic components on the upper cover 510 side. A recess 513 is provided on the inner surface of the upper cover 510, that is, when the upper cover 510 and the lower cover 520 are fastened together, the recess 513 extends from the inner surface of the upper cover 510 in a direction distant from the lower cover 520, so that the recess 513 accommodates a cylindrical electronic component protruding from the front surface of the circuit board, and the recess 513 attaches the cylindrical electronic component protruding from the front surface of the circuit board, thereby ensuring heat dissipation of such an electronic component on the upper cover 510 side. In one embodiment, the surface of the recess 513 is an arc surface, so as to ensure the attaching area between the recess 513 and the cylindrical electronic component. Certainly, since the size of the cylindrical electronic component is generally large, an opening running through in the vertical direction can be provided on the circuit board. The cylindrical electronic component is provided at the opening. Moreover, one half of the cylindrical electronic component protrudes from the front surface of the circuit board, and the other half of the cylindrical electronic component protrudes from the back surface of the circuit board.

Figure 7A:
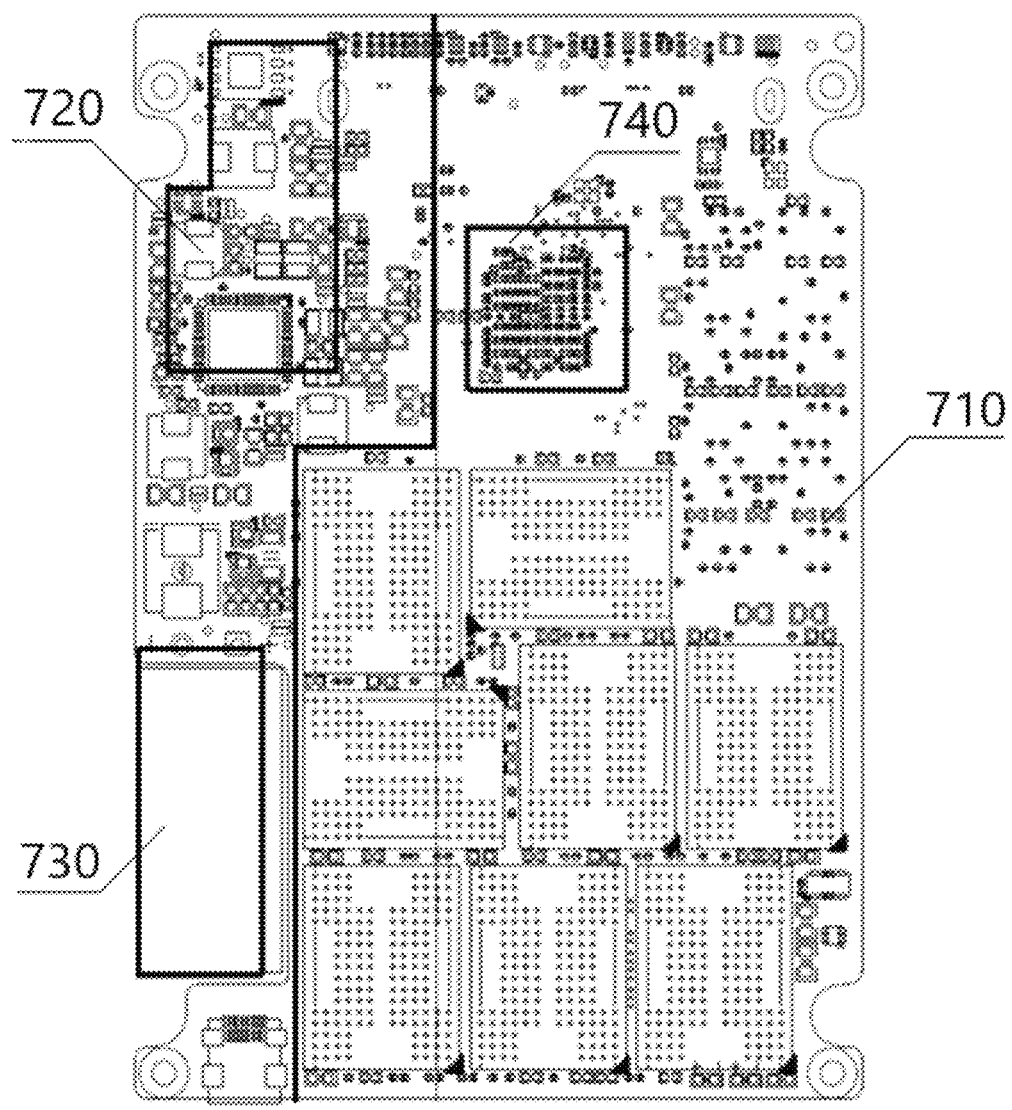
FIG. 7A is the schematic diagram I of the circuit board provided by another embodiment of the present disclosure.
Figure 7B:
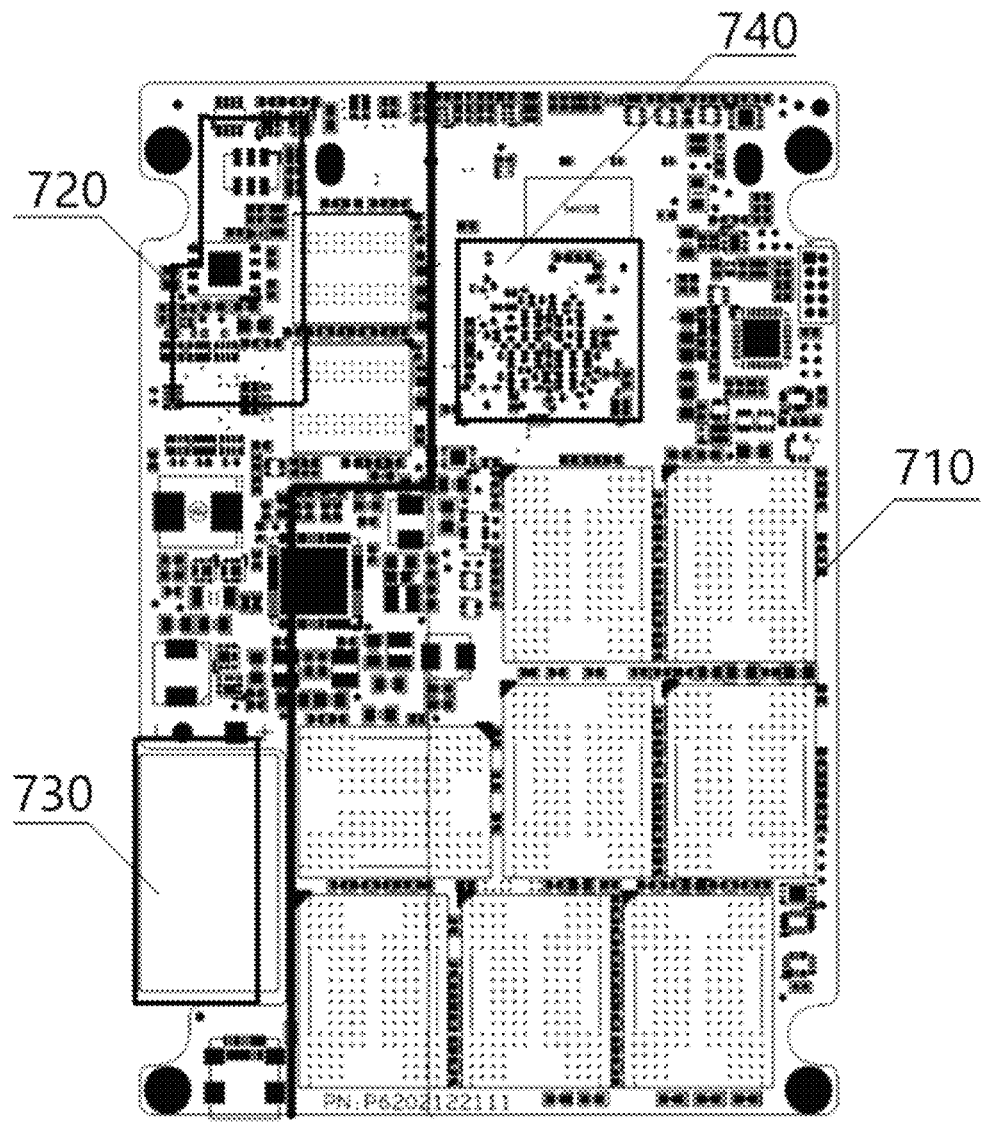
FIG. 7B is the schematic diagram II of the circuit board provided by another embodiment of the present disclosure.

On this basis, the projection 511 is located on one side of the inner surface of the upper cover 510, and the projection 512 and the recess 513 are located on the other side of the inner surface of the upper cover 510, so that the projection 111 attaches an electronic component such as a flash memory chip and a control chip (there may also be a DRAM chip) on the front surface of the circuit board, i.e., the part 710 on the front surface of the circuit board in FIG. 7A and FIG. 7B, to facilitate heat dissipation of the electronic component; the projection 512 attaches an electronic component such as a power management chip/power supply/voltage converter (there may also be a DRAM chip) on the front surface of the circuit board, i.e., the part 720 on the front surface of the circuit board in FIG. 7A and FIG. 7B, to facilitate heat dissipation of the electronic component; and the recess 513 accommodates a part of a standby power supply (a cylindrical capacitor) protruding from the front surface of the circuit board, i.e., the part 730 on the front surface of the circuit board in FIG. 7A and FIG. 7B, to facilitate heat dissipation of the electronic component.

The projection 512 is opposite to a part of the projection 511, and there is a gap of a predetermined distance between the projection 512 and the projection 511. The recess 513 is opposite to another part of the projection 511, and there is a gap of a predetermined distance between the recess 513 and the projection 511. Thus, the gap between the projection 512 and the projection 511 extends to the gap between the recess 513 and the projection 511 to form an air channel 514. Since the air channel 514 is lower than the projection 511 and the projection 512, the weight of the upper cover 510 is reduced by forming the air channel 514, thereby also reducing the weight of the solid state hard disk housing 500 and reducing the cost. In addition, since the air channel 514 is lower than the projection 511 and the projection 512, there is a certain space inside the solid state hard disk housing 500, thereby facilitating heat dissipation through air.

As an example, the upper cover 510 is rectangular. A first side edge of the projection 511 extends to an entire first long edge of the upper cover 510, a second side edge of the projection 511 extends to a part of a first short edge of the upper cover 510, a fourth side edge of the projection 511 extends to a part of a second short edge of the upper cover 510, the length of the second side edge of the projection 511 is less than the length of the fourth side edge of the projection 511, the distance from a first section of a third side edge of the projection 511 connected to the second side edge to the first side edge is equal to the length of the second side edge, and the distance from a second section of the third side edge of the projection 511 connected to the fourth side edge to the first side edge is equal to the length of the fourth side edge, so that the projection 511 is L-shaped. That is, the above first side edge, second side edge, third side edge, and fourth side edge are sequentially connected to define the L-shaped projection 511.

A first side edge of the projection 512 is opposite to the first section of the third side edge of the projection 511, a second side edge connected to the first side edge of the projection 512 is close to the first short edge of the upper cover 510, the length of a fourth side edge connected to the first side edge of the projection 512 is larger than the length of the second side edge, the distance from a first section of a third side edge of the projection 512 connected to the second side edge to the first side edge is equal to the length of the second side edge, and the distance from a second section of the third side edge of the projection 512 connected to the fourth side edge to the first side edge is equal to the length of the fourth side edge, so that the projection 512 is also L-shaped. Moreover, the L-shaped projection 512 can avoid blocking provision of the corresponding screw hole on the upper cover 510.

A first long edge of the recess 513 is opposite to the second section of the third side edge of the projection 511, and a second long edge of the recess 513 is distant from the second section of the third side edge of the projection 511.

The air channel 514 extends from the space between the first section of the third side edge of the projection 511 and the first side edge of the projection 512 to the space between the second section of the third side edge of the projection 511 and the recess 513, so as to form a curved air channel.

Figure 8:
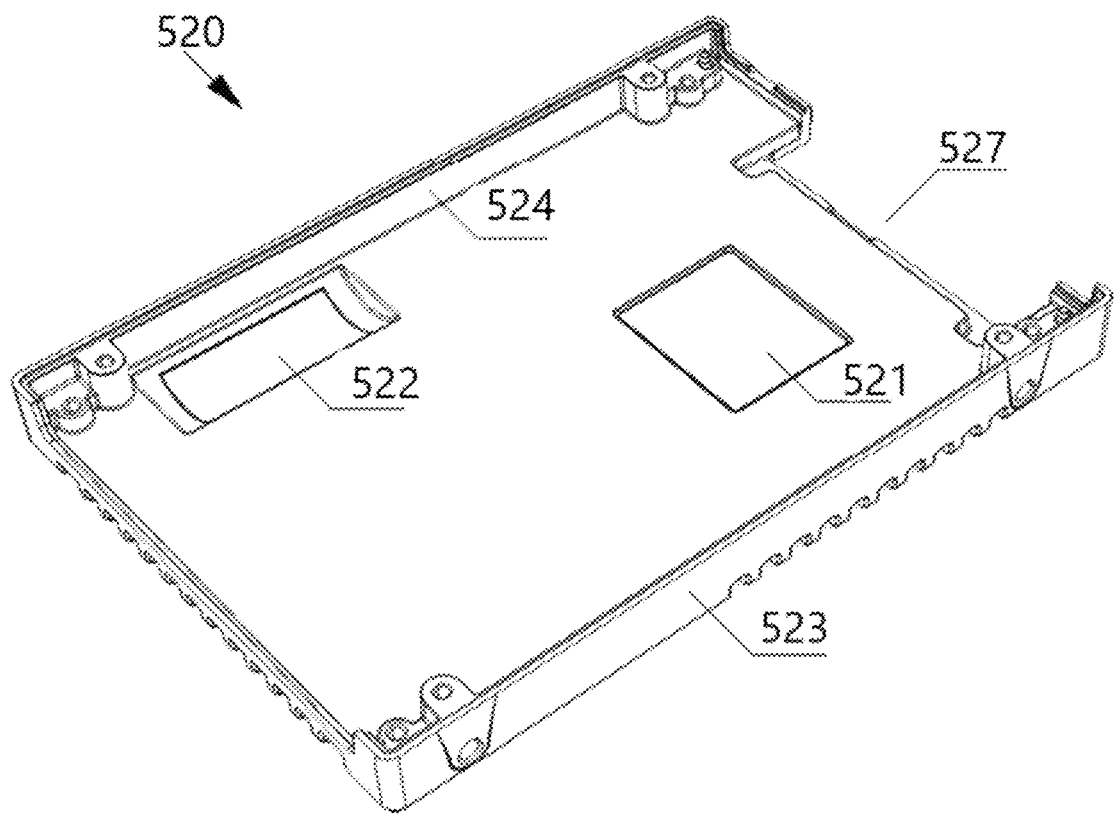
FIG. 8 is the internal schematic diagram of the lower cover provided by another embodiment of the present disclosure.

With reference to FIG. 8, FIG. 8 is a schematic diagram of the interior of a lower cover provided in another embodiment of the present disclosure.

The back surface of the circuit board is generally flat, the position of the control chip is slightly higher than other regions on the back surface of the circuit board, and a part of a cylindrical electronic component is on the back surface of the circuit board. Therefore, a recess 521 and a recess 522 are provided on the inner surface of the lower cover 520, that is, when the upper cover 510 and the lower cover 520 are fastened together, the recess 521 and the recess 522 extend from the inner surface of the lower cover 520 in a direction distant from the upper cover 510, so that the recess 521 attaches a flat electronic component protruding from the back surface of the circuit board, thereby ensuring heat dissipation of such an electronic component on the lower cover 520 side; and the recess 522 accommodates a cylindrical electronic component protruding from the back surface of the circuit board, and the recess 522 attaches the cylindrical electronic component protruding from the back surface of the circuit board, thereby ensuring heat dissipation of such an electronic component on the lower cover 520 side. The surface of the recess 522 is an arc surface to ensure the attaching area between the recess 522 and the cylindrical electronic component. The recess 522 and the recess 513 are configured to accommodate one cylindrical capacitor.

On this basis, the recess 521 is opposite to the projection 511, and the area of the recess 521 is smaller than the area of the projection 511, so that the recess 521 accommodates the control chip on the back surface of the circuit board (as the control chip protrudes from the back surface of the circuit board), thereby facilitating heat dissipation of the electronic component. The part 740 shown on the front surface of the circuit board in FIG. 7A and FIG. 7B is the mounting position of the control chip. The recess 522 is opposite to the recess 513, so that the recess 522 accommodates a part of the standby power supply (cylindrical capacitor) protruding from the back surface of the circuit board, i.e., part 730 on the circuit board in FIG. 7A and FIG. 7B, thereby facilitating heat dissipation of the electronic component.

As an example, the lower cover 520 is rectangular, and the recess 521 is located at a position in the middle of the lower cover 520 close to a short edge to accommodate the control chip. Generally, the control chip is rectangular, and therefore, the recess 521 in the present disclosure is also rectangular. The recess 522 and the recess 513 have the same shape, and are corresponding in position, so that the recess 513 on the upper cover 510 accommodates one half of the cylindrical electronic component, and the recess 521 on the lower cover 520 accommodates the other half of the cylindrical electronic component.

Further, in order to facilitate fastening of the upper cover 510 and the lower cover 520, in the present disclosure, a sidewall 515 and a sidewall 516 are provided at the two edges of the upper cover 510 located at the two ends of the air channel 514 (as shown in FIG. 6A and FIG. 6B). That is, the sidewall 515 and the sidewall 516 are distributed at two opposite edges of the upper cover 510, and the sidewall 515 and the sidewall 516 are located at the two ends of the air channel 514. A sidewall 523 and a sidewall 524 are provided at the two edges of the lower cover 520 having the same extension direction as the air channel 514 (as shown in FIG. 8). That is, the sidewall 523 and the sidewall 524 are distributed at two opposite edges of the lower cover 520, and the extension direction of the sidewall 523 and the sidewall 524 is the same as that of the air channel 514. When the upper cover 510 and the lower cover 520 are fastened together, the sidewall 515 and sidewall 516 of the upper cover 510 and the sidewall 523 and sidewall 524 of the lower cover 520 are combined to form sidewalls of the solid state hard disk housing 500.

Since solid state hard disks have various specifications, the arrangements of electronic components on their circuit boards are different, as shown in FIG. 7A and FIG. 7B. Although the arrangements of electronic components are different, the arrangements of electronic components are regular, and main components are classified and placed in a centralized manner. Specifically, an electronic component such as a flash memory chip (there may also be a DRAM chip) is arranged at the part 710 on the front surface of the circuit board; an electronic component such as a power management chip/power supply/voltage converter (there may also be a DRAM chip) is arranged at the part 720 on the front surface of the circuit board; a standby power supply is arranged at the part 730 on the front surface and back surface of the circuit board; and a control chip is arranged at the part 740 on the back surface of the circuit board.

On this basis, the projection 511 on the upper cover 510 in the present disclosure can attach the electronic component at the part 710 on the front surface of the circuit board, the projection 512 on the upper cover 510 can attach the electronic component at the part 720 on the front surface of the circuit board, the recess 513 on the upper cover 510 and the recess 522 on the lower cover 520 can accommodate the electronic component at the part 730 on the circuit board, and the recess 521 on the lower cover 520 can accommodate the part 740 on the back surface of the circuit board. Thus, the solid state hard disk housing 500 in the present disclosure can accommodate circuit boards of solid state hard disks of different specifications, and can effectively dissipate heat from electronic components when accommodating circuit boards of solid state hard disks of different specifications. Thus, the solid state hard disk housing 500 can be configured to assemble various storage devices.

Figure 9:
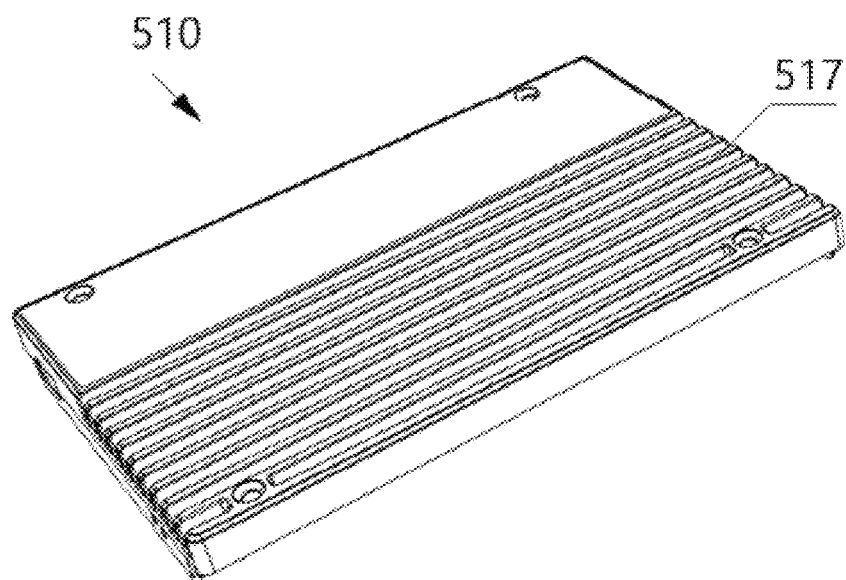
FIG. 9 is the external schematic diagram of the upper cover provided by another embodiment of the present disclosure.

With reference to FIG. 9, FIG. 9 is a schematic diagram of the exterior of an upper cover provided in another embodiment of the present disclosure.

A rib region 517 is provided on the outer surface of the upper cover 510, and the rib region 517 is opposite to the projection 511, so as to enhance heat dissipation of a flat electronic component attached to the projection 511. Specifically, the rib region 517 has multiple recesses recessed inward from the outer surface of the upper cover 510, and the recesses pass through two opposite edges of the upper cover 510 to increase the heat dissipation area of the rib region 517. In one embodiment, the multiple recesses of the rib region 517 have the same size, and the distances between adjacent recesses are equal.

Figure 10:
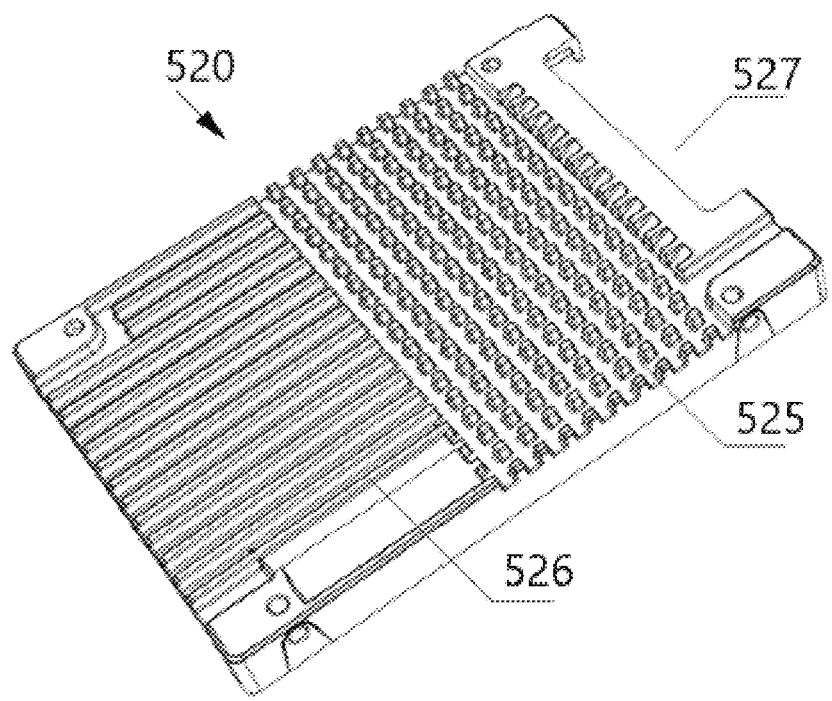
FIG. 10 is the external schematic diagram of the lower cover provided by another embodiment of the present disclosure.

With reference to FIG. 10, FIG. 10 is a schematic diagram of the exterior of a lower cover provided in another embodiment of the present disclosure.

A projection array 525 is provided on the outer surface of the lower cover 520, and the projection array 525 is opposite to the recess 521, so as to enhance heat dissipation of a flat electronic component accommodated in the recess 521. Specifically, the projection array 525 includes multiple columnar projections, and the projection array 525 formed by the multiple columnar projections supports flowing of airflows in two directions, so as to achieve better heat dissipation performance. In one embodiment, the multiple columnar projections in the projection array 525 have the same size, and the distances between adjacent columnar projections are equal. Since the recess 521 on the lower cover 520 in the present disclosure accommodates a control chip, and the control chip has a higher heat dissipation requirement, in the present disclosure, heat dissipation of the control chip having a higher heat dissipation requirement is performed through the projection array 525.

In addition, a rib region 526 is further provided on the outer surface of the lower cover 520 to increase the heat dissipation area. Specifically, the rib region 526 has multiple recesses recessed inward from the outer surface of the lower cover 520 to increase the heat dissipation area of the rib region 526. In one embodiment, the multiple recesses of the rib region 526 have the same size, and the distances between adjacent recesses are equal.

Figure 11A:
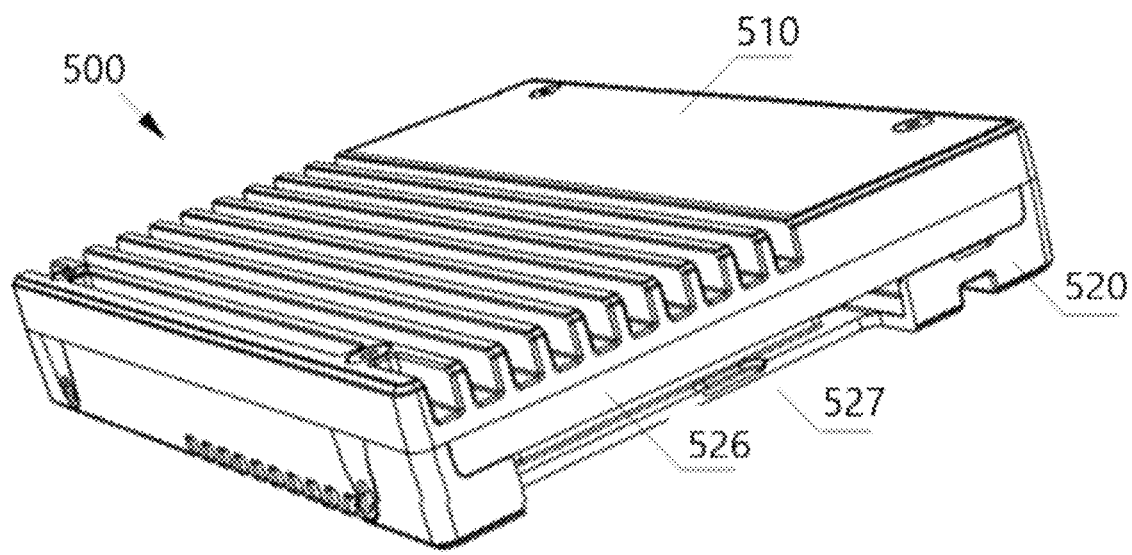
FIG. 11A is the schematic diagram I of the combined housing provided by another embodiment of the present disclosure.
Figure 11B:
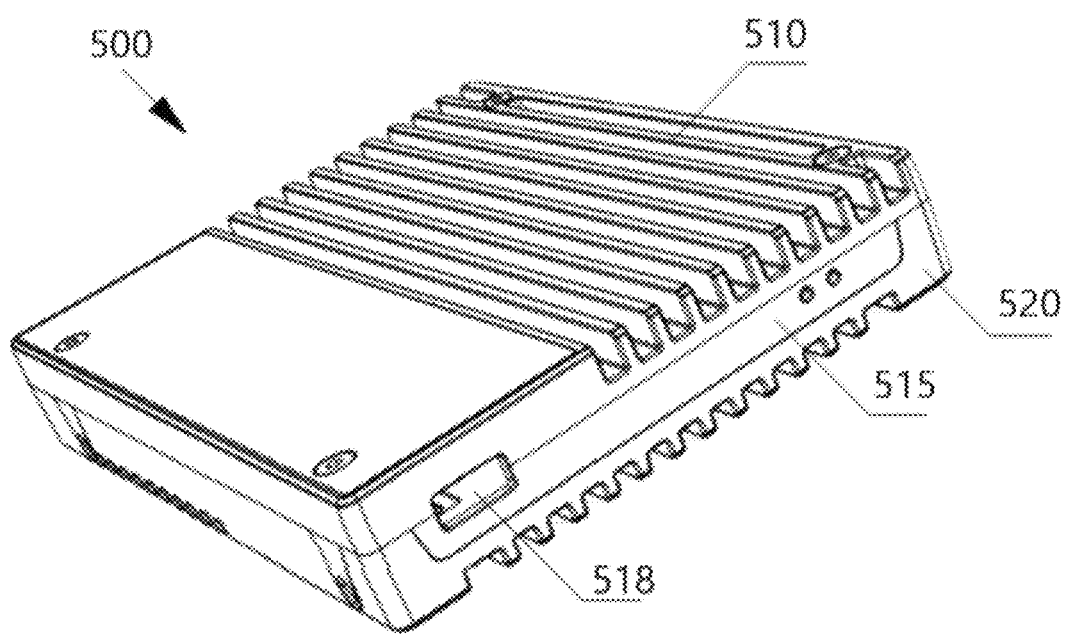
FIG. 11B is the schematic diagram II of the combined housing provided by another embodiment of the present disclosure.

On the basis of the above, the projection array 525 is located on one side of the outer surface of the lower cover 520, and the rib region 526 is located on the other side of the outer surface of the lower cover 520, so that the projection array 525 and the rib region 526 occupy the entire outer surface of the lower cover 520. With reference to FIG. 11A and FIG. 11B, FIG. 11A is a schematic diagram I of a combined housing provided in another embodiment of the present disclosure, and FIG. 11B is a schematic diagram II of a combined housing provided in another embodiment of the present disclosure.

On the basis of the above, an opening 518 is formed on the sidewall 515 of the upper cover 510 (as shown in FIG. 6A and FIG. 6B), and an opening 527 is formed at a position of the lower cover 520 corresponding to the sidewall 516 (as shown in FIG. 8). Moreover, the opening 518 is communicated with one end of the air channel 514, and the opening 527 is communicated with the other end of the air channel 514, thereby facilitating flow of air outside the solid state hard disk housing 500 into the air channel 514, and enhance heat dissipation of electronic components inside the housing 500 through air.

In addition, the opening 527 and the opening 518 are not only configured to communicate with the air channel 514 to achieve a better heat dissipation effect, but the opening 527 can also be configured to dispose a first connector of a solid state hard disk, and the opening 518 can also be configured to dispose a second connector (used for interface debugging) of the solid state hard disk, so as to implement communication connection between the circuit board inside the solid state hard disk housing 500 and the outside of the solid state hard disk housing 500.

In the present disclosure, since the upper cover 510 is provided with a recess 513 for accommodating a cylindrical electronic component, and the lower cover 520 is provided with a recess 521 for accommodating a flat electronic component and a recess 522 for accommodating a cylindrical electronic component, the solid state hard disk housing 500 in the present disclosure has enough spaces inside to accommodate electronic components of shapes and sizes on the circuit board. In addition, the upper cover 510 is provided with projections 511 and 512 attached to flat electronic components, the recess 513 on the upper cover 510 can also attach a cylindrical electronic component, the recess 521 on the lower cover 520 can also accommodate a flat electronic component, and the recess 522 on the lower cover 520 can also attach the cylindrical electronic component, thus ensuring heat dissipation of different electronic components in the solid state hard disk housing 500.

The present disclosure further provides a solid state hard disk, including a circuit board, an electrolytic capacitor, and a solid state hard disk casing. The electrolytic capacitor and the circuit board are both fixed in the solid state hard disk casing.

For those skilled in the art, the present disclosure is apparently not limited to the details of the above exemplary embodiments, and the present disclosure can be implemented in other specific forms without departing from the spirit or basic features of the present disclosure. Accordingly, anyway, the embodiments should be considered to be exemplary and nonrestrictive. The scope of the present disclosure is defined by the appended claims rather than the above description, thus all changes falling within the meaning and scope of equivalent conditions of the claims are intended to be included in the present disclosure. Any reference numeral in the claims should not be regarded as limiting the claims involved.

In addition, it should be understood that the description is described in accordance with embodiments, but not every embodiment only contains one independent technical solution, and such narrative manner of the description is only for the sake of clarity, thus those skilled in the art should regard the description as a whole, and the technical solutions in various embodiments may also be appropriately combined to form other embodiments that may be understood by those skilled in the art.

The invention claimed is:

1. A solid state hard disk casing, comprising an upper casing and a lower casing fastened to each other, wherein
   a first lower recess is provided on a side of an inner surface of the lower casing close to one long edge of the lower casing, to accommodate a first portion of one or multiple electrolytic capacitors;
   a first upper recess is provided on a side of an inner surface of the upper casing close to one long edge of the upper casing, and the first upper recess is opposite to the first lower recess, to accommodate a second portion of the electrolytic capacitor placed in the first lower recess;
   a side of the inner surface of the lower casing is close to the other long edge of the lower casing configured to fix a circuit board connected to the electrolytic capacitor; and
   the circuit board and the first lower recess accommodating the electrolytic capacitor are respectively adjacent to two opposite long edges of the lower casing,
   wherein the multiple electrolytic capacitors in the first lower recess/first upper recess are parallel to each other, and a placement direction of the electrolytic capacitors in the first lower recess and the first upper recess is perpendicular to an extension direction of the electrolytic capacitors in the first lower recess/first upper recess.

2. The solid state hard disk casing according to claim 1, wherein a width of the first lower recess/the first upper recess is just enough to accommodate a length of the electrolytic capacitor.

3. The solid state hard disk casing according to claim 2, wherein fastening protrusions extending upward are provided at four corners of the inner surface of the lower casing, and an upper surface of each of the fastening protrusions is provided with a screw hole extending downward; and
   through-screw holes are provided at four corners of the upper casing, so that screws pass through the screw holes on the upper casing and screw into the screw holes on the fastening protrusions to fasten the upper casing and the lower casing.

4. The solid state hard disk casing according to claim 3, wherein a height of the fastening protrusions are lower than a height of a sidewall of the lower casing; and
   a part around the screw hole on the upper casing is recessed downward from an outer surface of the upper casing, and a part around the screw hole on the upper casing is protrude downward from the inner surface of the upper casing to form a projection, so as to fit the fastening protrusions.

5. The solid state hard disk casing according to claim 4, wherein the first lower recess is provided between two fastening protrusions on the lower casing, wherein the two fastening protrusions are close to a same long edge of the lower casing; and
   the first upper recess is provided between two projections on the upper casing, wherein the two projections are close to a same long edge of the upper casing.

6. The solid state hard disk casing according to claim 5, wherein a second lower recess is further provided between a short edge of the first lower recess and a sidewall in a short edge direction of the lower casing, to accommodate a first portion of one or multiple electrolytic capacitors; and
   a second upper recess is further provided between a short edge of the first upper recess and a sidewall in a short edge direction of the upper casing, the second upper recess is opposite to the second lower recess, and the second upper recess accommodates a second portion of the electrolytic capacitor placed in the second lower recess.

7. The solid state hard disk casing according to claim 6, wherein a third lower recess corresponding to a capacitor through hole is provided on the inner surface of the lower casing, to accommodate a first portion of one or multiple electrolytic capacitors through the third lower recess, and the capacitor through hole is provided at a vacant position of the circuit board and runs through the circuit board; and
   a third upper recess corresponding to the capacitor through hole on the circuit board is provided on the inner surface of the upper casing, and the third upper recess is opposite to the third lower recess, to accommodate a second portion of the electrolytic capacitor placed in the third lower recess and passing through the capacitor through hole.

8. The solid state hard disk casing according to claim 7, wherein contacts are provided at positions of the circuit board close to the first lower recess and the second lower recess to connect with the electrolytic capacitors placed in the first lower recess and the second lower recess;
   pins of the electrolytic capacitors in the first lower recess and the second lower recess face a side of the circuit board; and
   there is a predetermined distance between adjacent contacts to ensure safety when the electrolytic capacitors are discharged.

9. The solid state hard disk casing according to claim 7, further comprising a circuit board, an electrolytic capacitor, and a solid state hard disk casing, wherein
   the electrolytic capacitor and the circuit board are fixed in the solid state hard disk casing.

10. A solid state hard disk, comprising a circuit board, an electrolytic capacitor, and the solid state hard disk casing according to claim 1; wherein
the electrolytic capacitor and the circuit board are fixed in the solid state hard disk casing.

11. A solid state hard disk casing, comprising an upper cover and a lower cover that are fastened to each other, wherein
a first projection, a second projection, and a first recess are provided on an inner surface of the upper cover, the first projection and the second projection are configured to attach a flat electronic component protruding from a front surface of a circuit board, and the first recess is configured to accommodate a cylindrical electronic component protruding from the front surface of the circuit board; and
a second recess and a third recess are provided on an inner surface of the lower cover, the second recess is configured to attach a flat electronic component protruding from a back surface of the circuit board, and the third recess is configured to accommodate a cylindrical electronic component protruding from the back surface of the circuit board.

12. The solid state hard disk casing according to claim 11, wherein the first projection is located on one side of the inner surface of the upper cover, and the second projection and the first recess are located on another side of the inner surface of the upper cover;
the second projection is opposite to a part of the first projection, there is a gap of a predetermined distance between the second projection and the first projection, the first recess is opposite to another part of the first projection, and there is a gap of a predetermined distance between the first recess and the first projection; and
the gap between the second projection and the first projection extends to the gap between the first recess and the first projection to form an air channel.

13. The solid state hard disk casing according to claim 12, wherein a first sidewall and a second sidewall are provided at two edges of the upper cover on both ends of the air channel; a third sidewall and a fourth sidewall are provided at two edges of the lower cover extending in the same direction as the air channel; and the first sidewall, the second sidewall, the third sidewall, and the fourth sidewall are combined to form a sidewall of the solid state hard disk casing.

14. The solid state hard disk casing according to claim 13, wherein a first opening is formed on the first sidewall of the upper cover, a second opening is formed at a position of the lower cover corresponding to the second sidewall, the first opening is communicated with one end of the air channel, and the second opening is communicated with the other end of the air channel.

15. The solid state hard disk casing according to claim 14, wherein the first opening is configured to install a first connector of a solid state hard disk, and the second opening is configured to install a second connector of the solid state hard disk.

16. The solid state hard disk casing according to claim 11, wherein the second recess is opposite to the first projection, and an area of the second recess is smaller than an area of the first projection.

17. The solid state hard disk casing according to claim 11, wherein the third recess is opposite to the first recess.

18. The solid state hard disk casing according to claim 11, wherein a first rib region is provided on an outer surface of the upper cover, and the first rib region is opposite to the first projection.

19. The solid state hard disk casing according to claim 11, wherein a projection array is provided on an outer surface of the lower cover, and the projection array is opposite to the second recess.

20. The solid state hard disk casing according to claim 19, wherein a second rib region is provided on the outer surface of the lower cover, the second rib region is located on one side of the outer surface of the lower cover, and the projection array is located on another side of the outer surface of the lower cover.

* * * * *